US011647601B2

United States Patent
Achillopoulos

(10) Patent No.: US 11,647,601 B2
(45) Date of Patent: May 9, 2023

(54) CABINET SOLUTION FOR OUTDOOR ELECTRONIC DEVICE STORAGE AND RETRIEVAL

(71) Applicant: Evangelos Achillopoulos, Alimos (GR)

(72) Inventor: Evangelos Achillopoulos, Alimos (GR)

(73) Assignee: ACROMOVE INC., San Fernando, CA (US)

( * ) Notice: Subject to any disclaimer, the term of this patent is extended or adjusted under 35 U.S.C. 154(b) by 334 days.

(21) Appl. No.: 16/920,702

(22) Filed: Jul. 4, 2020

(65) Prior Publication Data

US 2021/0007234 A1  Jan. 7, 2021

Related U.S. Application Data

(60) Provisional application No. 62/871,154, filed on Jul. 7, 2019.

(51) Int. Cl.
*H05K 7/14* (2006.01)
*H02G 3/08* (2006.01)

(52) U.S. Cl.
CPC .............. *H05K 7/14* (2013.01); *H02G 3/081* (2013.01)

(58) Field of Classification Search
CPC ................................. H02G 3/081; H05K 7/14
See application file for complete search history.

(56) References Cited

U.S. PATENT DOCUMENTS

| | | | | | |
|---|---|---|---|---|---|
| 1,603,404 | A | * | 10/1926 | Proctor | E05C 7/002 292/99 |
| 2,635,027 | A | * | 4/1953 | Rasmussen | A47L 19/04 312/351 |
| 10,498,121 | B1 | * | 12/2019 | Luo | H02G 3/18 |
| 2002/0084728 | A1 | * | 7/2002 | Elm | E05B 53/005 312/222 |
| 2018/0034253 | A1 | * | 2/2018 | Mortun | H02G 3/088 |
| 2020/0067295 | A1 | * | 2/2020 | Kisselstein | H02G 3/085 |
| 2020/0112154 | A1 | * | 4/2020 | Mortun | H02G 3/081 |

* cited by examiner

*Primary Examiner* — Matthew W Ing
(74) *Attorney, Agent, or Firm* — DP IP Group; Frank De Liguori

(57) ABSTRACT

A cabinet solution is provided for outdoor electronic device storage and retrieval especially configured for ease access during inclement weather. In one embodiment, the cabinet solution is comprised of a specially designed secure cabinet and a top access weather protected portable device designed to operate as a data center in a box. The secure cabinet is configured to hold a number of top access weather protected portable devices configured in the same or different configurations depending on the application. The portable devices are mounted in an inclined shelf with a mechanism connected with the cabinet door opening that closes partially the top lid of the devices in such a way that prevent rain or snow to interfere with the functionality of the system while the door of the cabinet is open thus making it serviceable even on bad weather conditions.

20 Claims, 10 Drawing Sheets

CABINET SOLUTION FOR OUTDOOR ELECTRONIC DEVICE STORAGE AND RETRIEVAL

RELATED APPLICATION

This application claims the benefit of U.S. Provisional Patent Application No. 62/871,154, filed Jul. 7, 2019.

BACKGROUND

Field of the Invention

The present disclosure relates to a cabinet solution for outdoor electronic device storage and retrieval especially configured for ease access during inclement weather.

Background Information

At the side of the road in cities and in rural areas there are environmentally shielded cabinets, housing various equipment that usually interconnect telecom networks or process locally switching of data to various clients at the edge of the network.

With the advent of Cloud and the centralization of the information the problem of low latency applications surfaced the industry. Internet of Things and Industry-4 together with upcoming 5G Mobile Networks and Autonomous Vehicles a new technology of Hybrid Cloud topology has emerged called Edge Computing.

Edge Computing is the Cloud architecture that puts Compute and Data Storage recourses at the Edge of the Network thus in close vicinity from the users of the Cloud in order to minimize the network latency, while keeping the existing centralized infrastructure and manage all together (the Edge resources and the Centralized resources) as a big Cloud system through the internet.

New server and data storage devices have emerged to cover the needs for Edge Computing which is quite diverse. Edge devices needed indoors at big buildings, in roof tops under a cell tower, at the side of the road, in office environment, in industrial operation etc. On top of that Edge has a temporal nature, where and when there is a need Edge Compute and Storage nodes can be added or removed from the network at will. Existing computer systems for use in Cloud are based on the 19" Rack System, Edge computing servers follow the same form factor and all components are standardized to the 19" Rack system. These devices are rarely designed to withstand the water spray and winds. Some are, but for military use only while they are very expensive.

When rack devices are installed indoors nothing special is needed to be used apart from security and adequate ventilation. On the other hand, when used in outdoors applications special environmentally protected cabinets are typically used to protect the equipment from the elements.

With existing solutions when there is severe weather these installations can't be accessed and serviced, i.e. exchange a malfunctioning rack server, because it is extremely difficult to open the cabinets during rain with wind, because water will enter and in the current state of the art the rack device-cabinet combination used aren't designed to allow servicing during bad weather coz there is nothing to protect the cabling connectors and the airflow from droplets of water that might enter the cabinet and the rack devices.

The temporal nature of the Edge Computing combined with the remote locations where the Edge nodes are deployed has created a need for portable and shippable devices that can withstand the hurdles of constant shipping and at the same time be weatherproof to be protected from the elements when shipped and be resistant to water droplets. Such portable devices are described by Achillopoulos U.S. Pat. No. 9,977,481 with a top access form factor but there is no solution for an outdoors cabinet that can be opened and exchange malfunctioning devices during bad weather times.

SUMMARY

The present disclosure relates to a cabinet solution for outdoor electronic device storage and retrieval especially configured for ease access during inclement weather.

In one embodiment, the solution is comprised of a specially designed secure cabinet and a top access weather protected portable device designed to operate as a data center in a box. The secure cabinet can hold a number of top access weather protected portable devices configured in the same or different configurations depending on the application. The portable devices are mounted in an inclined shelf with a mechanism connected with the cabinet door opening that closes partially the top lid of the devices in such a way that prevent rain or snow to interfere with the functionality of the system while the door of the cabinet is open thus making it serviceable even on bad weather conditions.

DETAILED DESCRIPTION OF THE INVENTION

The word "exemplary" is used herein to mean "serving as an example, instance, or illustration." Any embodiment described herein as "exemplary" is not necessarily to be construed as preferred or advantageous over other embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a system" or "a device" includes one system or device as well as plural systems or devices.

The present disclosure relates to a cabinet solution for outdoor electronic device storage and retrieval especially configured for ease access during inclement weather. Exemplary embodiments of the cabinet solution for outdoor electronic device storage and retrieval is described in conjunction with FIGS. 1-9 discussed below, wherein like numerals represent like elements throughout the figures.

Figure 1:
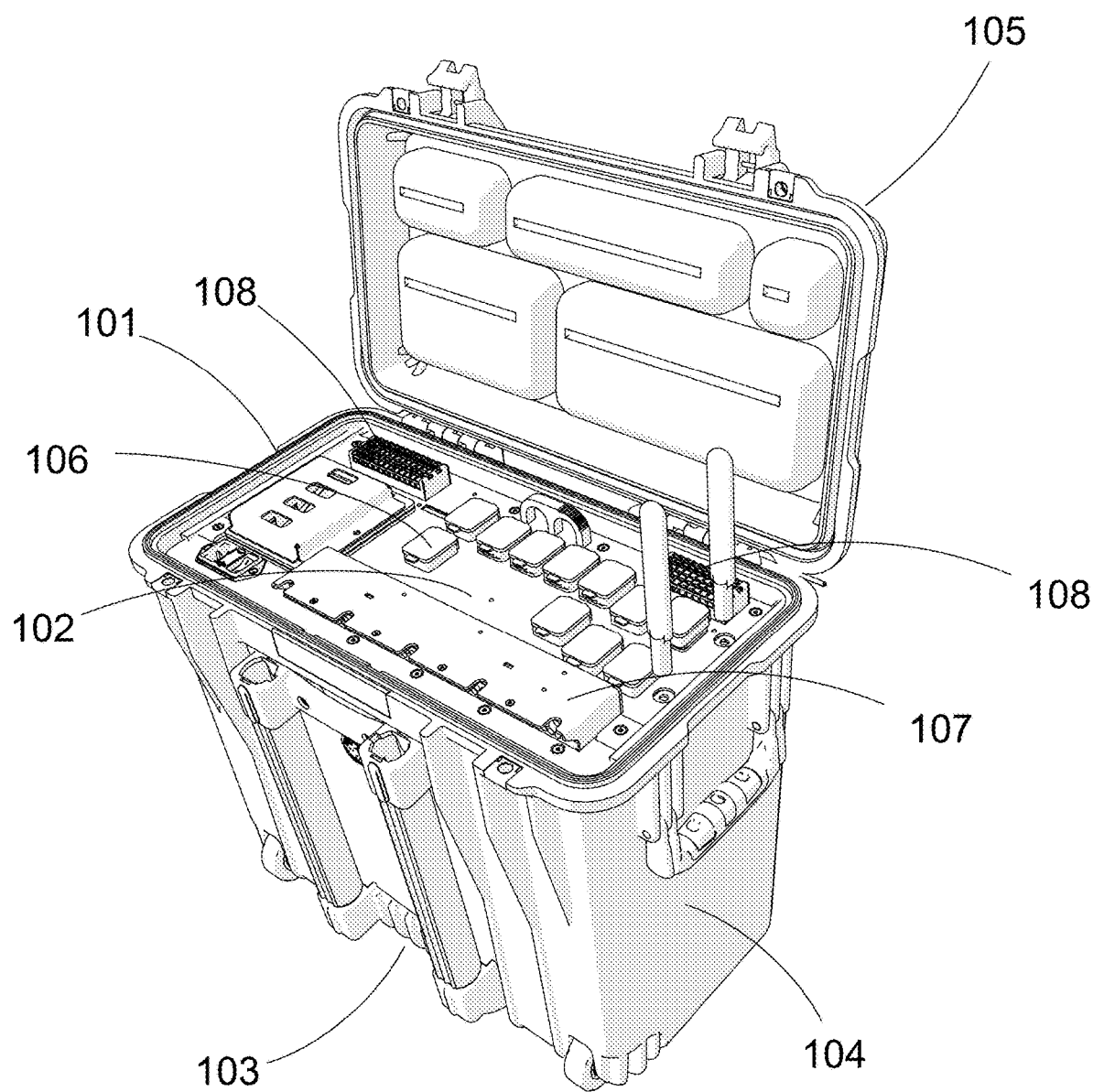
FIG. 1 the portable device example with the top lid opened.
Figure 2:
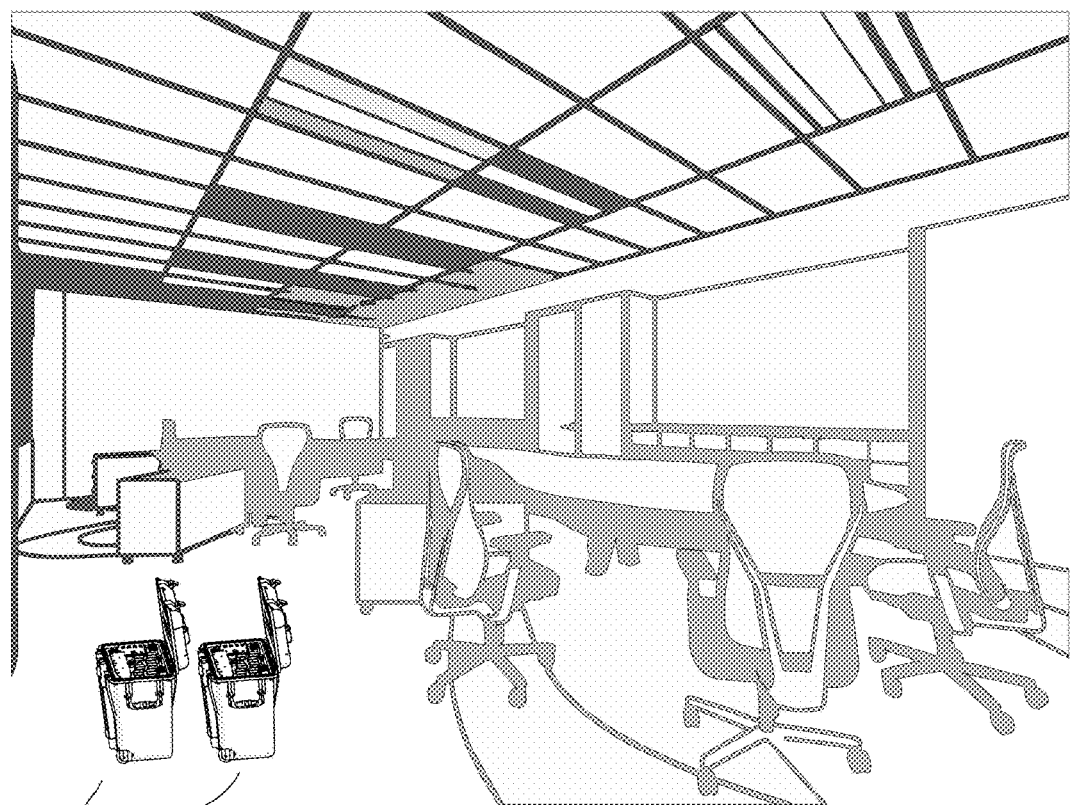
FIG. 2 two portable devices in an indoors office environment standing on the floor.
Figure 3:
FIG. 3 two portable devices in an indoors building hallway environment inside a secure storage shelving cabinet.
Figure 4:
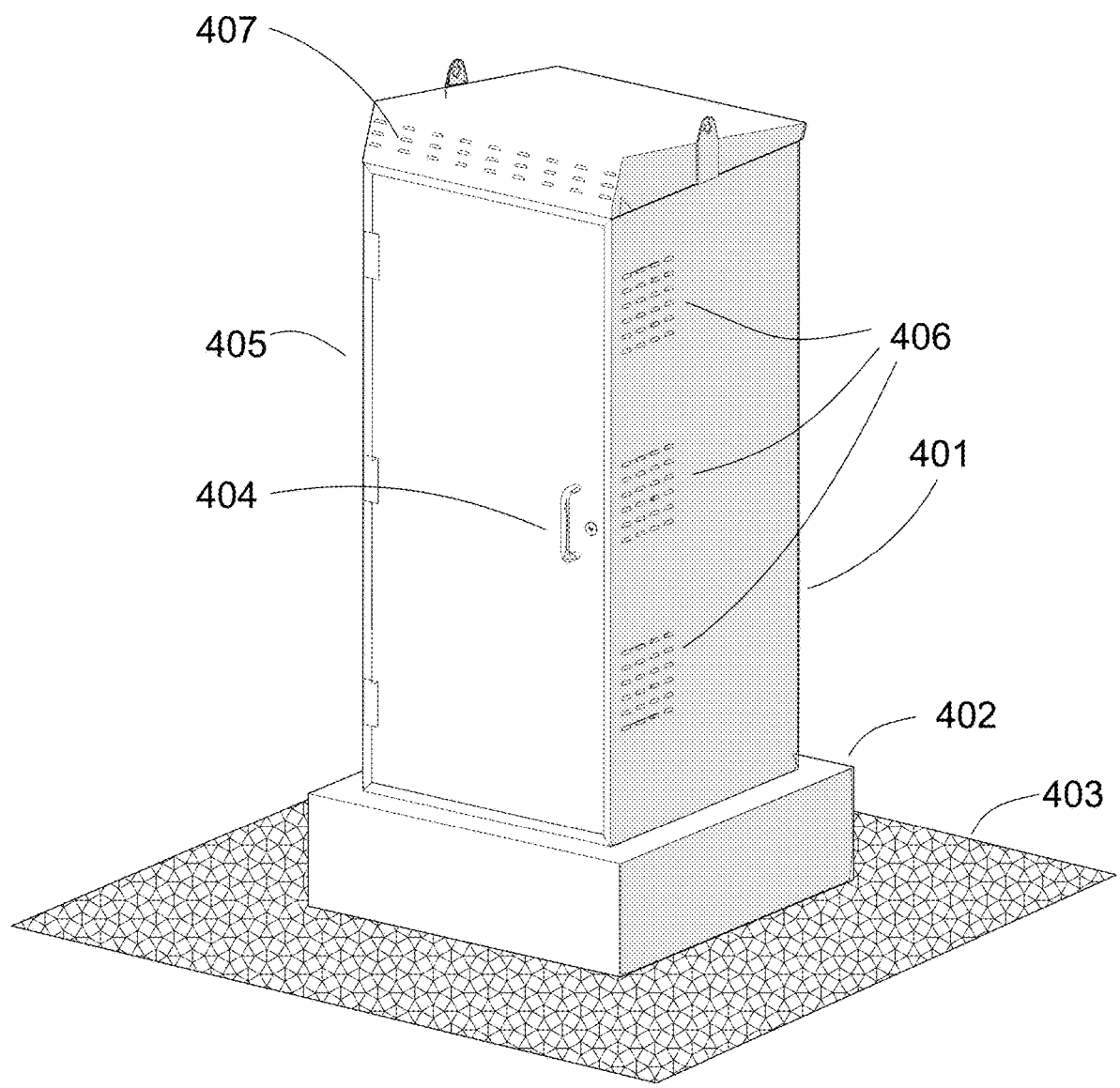
FIG. 4 a secure cabinet in an outdoors side of the road environment mounted on a cement base on the pavement.
Figure 5:
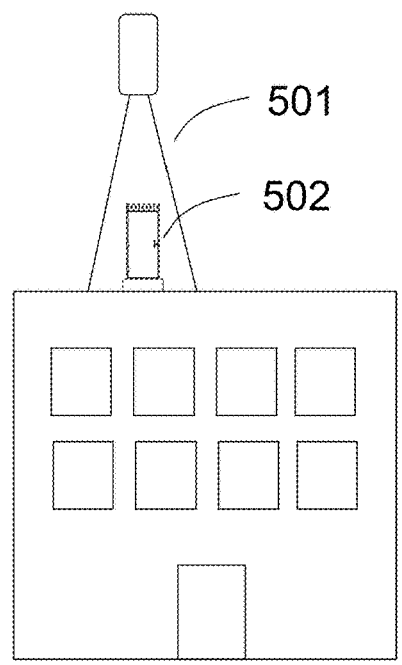
FIG. 5 a secure cabinet in a terrace under a cell tower.
Figure 6:
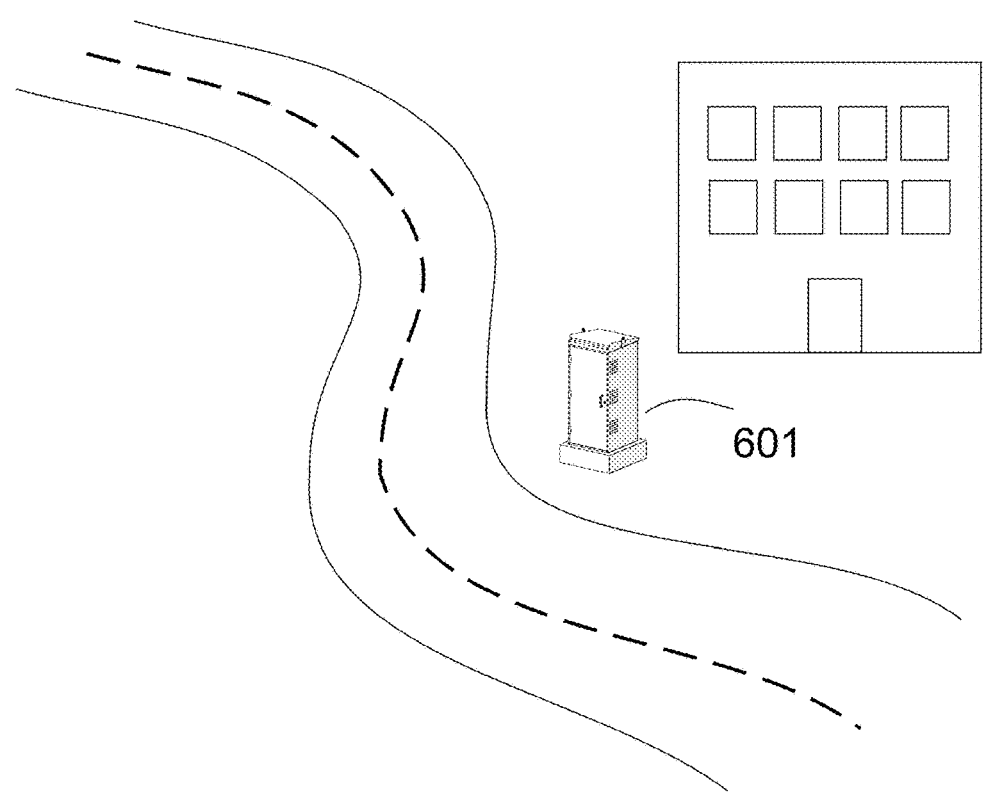
FIG. 6 a secure cabinet in an outdoors side of the road environment outside of a building.
Figure 7:
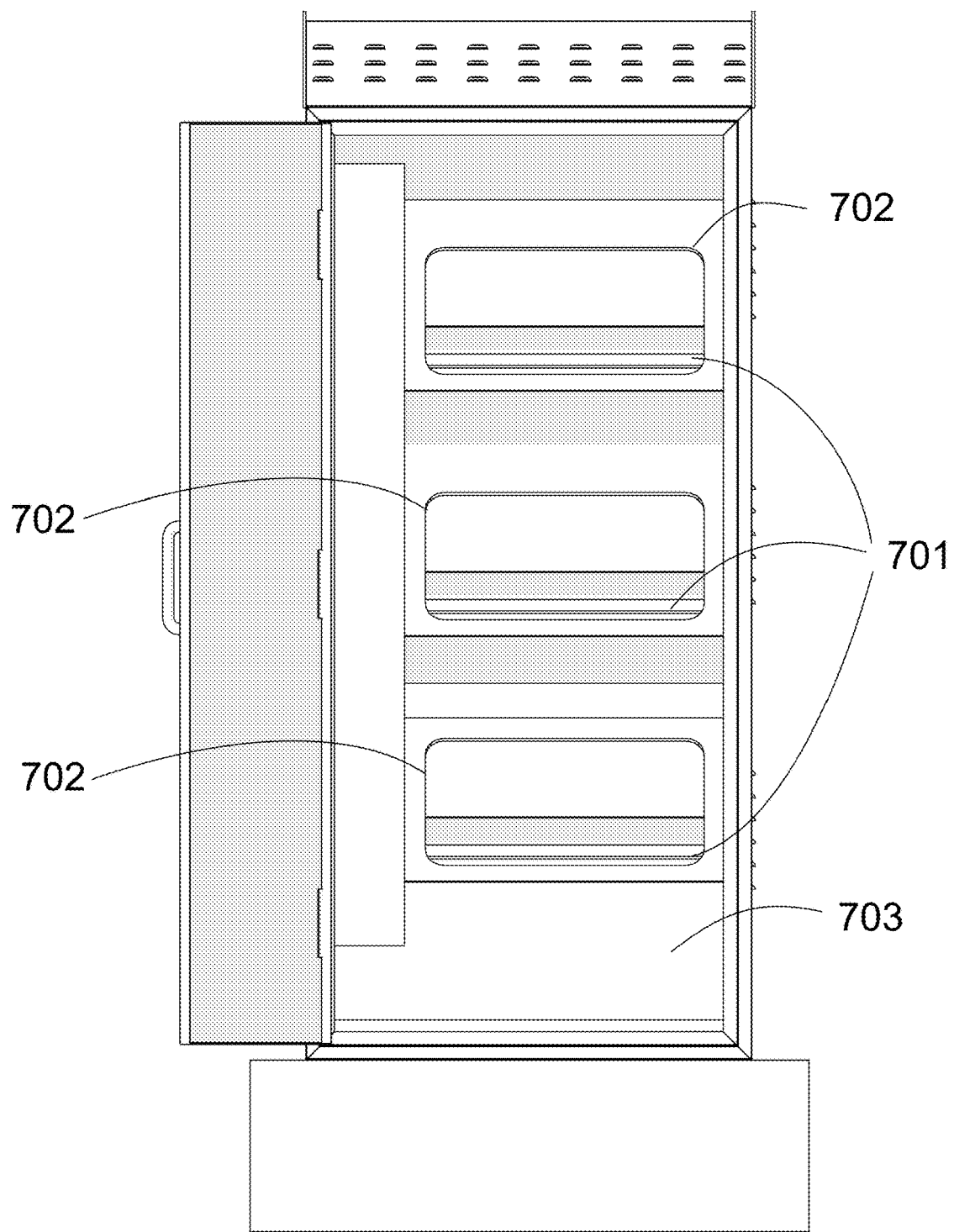
FIG. 7 a secure cabinet front view with the shelf slots ready to accept devices in place FIG. 8 placing devices inside the secure cabinet.

In FIG. 1 we show a portable device 101 which is similar to that described by Achillopoulos U.S. Pat. No. 9,977,481 that has top access 102 and it is protected at the bottom and on the sides of the case 104 from water and dust when the top lid 105 is open thus the device has all the connection top panel 106 and ventilation intake 107 and ventilation outtake 108 from one side (top side) where there is a lid 105 that opens to make accessible all the connections and allow the cooling 102 of the device during operation. Moreover, the device connection top panel 106 has a water and dust protection (with the use of special connectors and covers) rating equivalent to IP52 when standing with open lid and a rating equivalent to IP54 when inclined with the air intake facing down with a device angle from standing position greater than 50 degrees down.

A top access device has the advantage of single side accessibility which in certain limited space applications is very important, especially when there is no access from the back of an external housing, i.e. on a building corridor cabinet.

A fully intergraded device in a flight case 101 like this can be a small data center in a box which includes a single server or more than one server with or without storage like hard disks or solid state disks, networking with a single or multiply LAN switch or routers, a power management and battery backup system (UPS) and means to remote manage the device using various wireless technologies (i.e. 4G modem, WiFi or Iridium satellite communications), can be easily shipped to a client and be used as a standalone device or form a cluster of servers using more than one device.

Exemplary indoors uses of the portable device 101 or set of devices can be, with open lid on the floor of a room standing 201, or on shelfs on a storage rack, or in a locking secure shelf cabinet in the sides 301 of a public use hallway or corridor of big building and many more.

When used outdoors the portable devices need an environmentally protected housing system like a reinforced metallic secure cabinet system with front access door 401 mounted on a concrete base 402 that allows all the cable connections to the networks and power that are below the pavement 403 to pass securely to the devices at the back side of the cabinet where a secondary secure door can help the access of the service personnel to the cabinet during installation or in good weather times.

This environmentally protected cabinet system aims to protect the devices from the elements, vandalism and unauthorized physical access from third parties. There is a secure lock and heavy-duty handle 404 that can be hided in the door when is closed and locked.

Said secure cabinet system can incorporate active or passive cooling mechanisms, such as heat pumps and/or fans to circulate the air in order to control and emit to the outside environment the heat buildup inside the cabinet from the heat dissipation of the devices that are installed and operate 24/7. This can be done either by having the cabinet hermetically closed from water and air using the active cooling system 405 (also on 902) of a single or redundant heat pump, or by using passive system with fans to take the external cooler air 406 (also on 903), pass it through dust filters and a dehumidifier in order the air to be clean from humidity and dust, cool the devices and then exit from the top of the cabinet 407 (also on 904).

There can also be a combination of the two cooling systems when extremely high temperatures are outside of the cabinet. Additionally, in extremely low temperature environments an electric air heater can be used to maintain the devices in the operational envelope.

Exemplary uses of the outdoors device—secure cabinet system is, installed under a Cell Tower 501 to facilitate the upcoming 5G processing loads in a terrace 502, installed outside of a building in the side of the road 601 to act as an Edge computing node and many more other outdoor applications.

In another exemplary embodiment the said secure cabinet can also host a set of extra AC to DC power supplies and a set of batteries with an AC or solar charger to extend run time of existing battery backup system that is present on each of the portable devices and support the portable devices with DC power in case of a failure of the AC to DC power supplies that are included on the portable devices thus act as an external power redundancy and battery backup.

The portable devices have a DC input with one plug that allows additionally bidirectional CAN-BUS communication between the systems supporting (cooling/heating, AC-DC power support, battery system and security system) the secure cabinet and the portable devices. In this way with a single connection on each device, all devices can have external DC power therefor a redundant AC-DC power supply and at the same time, know i.e. the runtime of the external battery backup, the status of the external utility power (if there is a failure, the voltage level etc.), the temperature and the humidity outside of the secure cabinet, the security status (if the cabinet is open or closed) and many more.

The shelfs inside the secure cabinet 701 can be one or as many as they can fit for the application it is intendent to be used, in this exemplary embodiment we see three shelfs 701. The shelfs are inclined and have a cover with an opening 702 that fits the shape of bottom case which houses the devices, which together with the shelf forms a slot. The opening 702 has a foam rubber gasket in order to seal from water and dust the back of the cabinet from the front when a device fits in the slot. In another exemplary embodiment the slots and the shelfs that fit the devices can be made with a mold in one piece from plastic, or silicon, or fiberglass plastic in order to be totally water tight the back of the cabinet. Also, at the bottom 703 there is an angled surface that acts as a drain to drive all the water that falls down inside the cabinet to drain out of the cabinet. In an alternative embodiment a slot is not used can be covered with a removable watertight cover.

Figure 8:
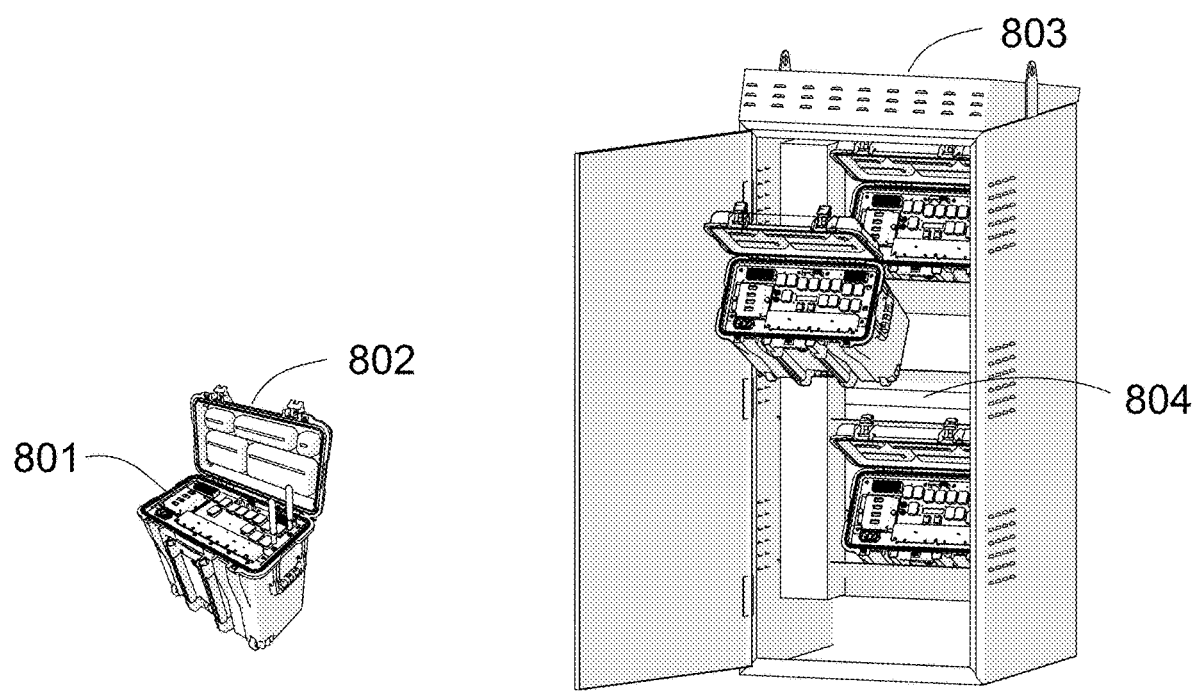

In FIG. 8 we see a portable device 801 with the top lid open 802 ready to be inserted in the outdoors secure cabinet of 803 in the slightly inclined shelf 804 inside the secure cabinet. If there is bad weather with possibility of rain the device can be kept with the lid closed where in this state the portable device is totally waterproof with equivalent rating of IP67 (submersible for up to 30 m in 1 m depth) and can still be inserted in the secure cabinet slot and on a later stage have the lid opened inside the cabinet when not in direct contact with the elements and in position to open the lid.

Removal of the device can be as easy as the insertion of a new device to the secure cabinet. The user shutdown the device, disconnects the cables, fully closes the lid, holds the device from the handle and pulls' the device out from the slot. The device with fully closed lid is totally waterproof so it can be managed easily even during rain or snowing.

Figure 9:
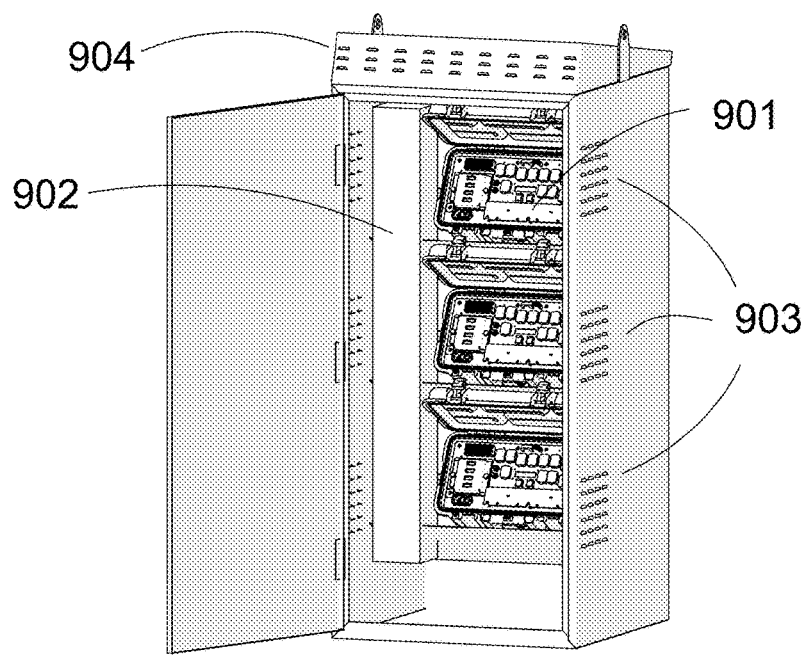
FIG. 9 the secure cabinet with three devices fitted in final positions.

In FIG. 9 we see three portable devices 901 with the top lids open inside the secure cabinet in this inclined slot position. At the side 902 is the area where the active cooling/heating and extra DC power supply with the extra battery backup can be hosted in a way each of the three systems (a) active cooling/heating, (b) extra DC power supply, (c) extra battery backup, (d) cabinet security system, can be hot pluggable and removable in case of failure.

In an alternative embodiment on the other side of the secure cabinet can be a water or snow resistant cable management guide system that will allow the positioning of the cabling to the devices in a way that will protect the cabling from rain water or snow water ingress.

Figure 10:
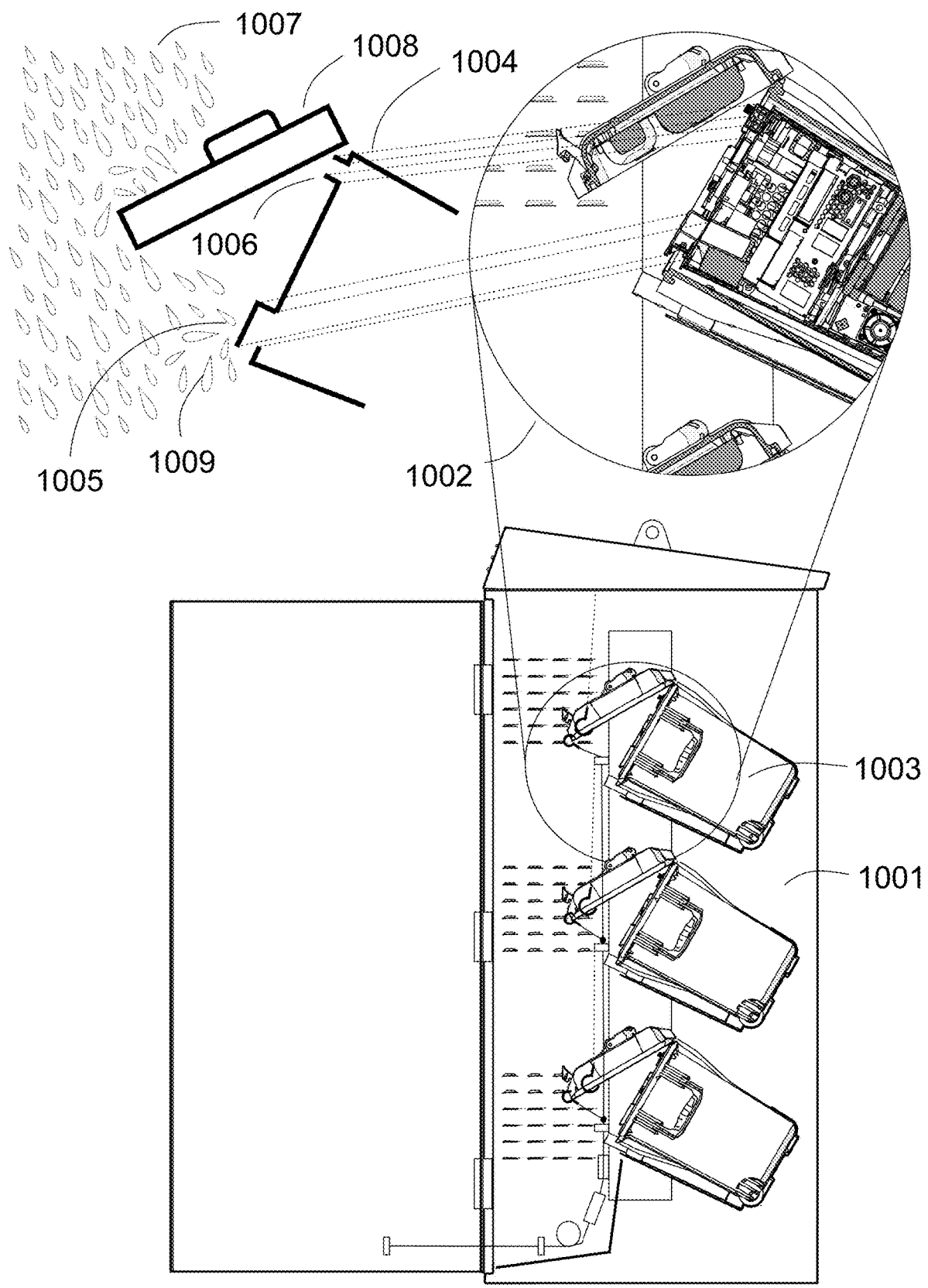
FIG. 10 the secure cabinet side section detail exhibiting how it prevents water ingress due to shape of the portable devices.

In FIG. 10 we see the side section view 1001 and the detailed section view 1003 of the portable device inclined while standing on the shelf 1003. On the simple straight lines section representation of the portable device 1004, we can see the air intake vent shape 1005 that due to the inclined position of the device and the downwards looking vent the water droplets from a rain 1007 that fall outside of the cabinet during a servicing incident or a device exchange operation, drain down 1009 without entering the device. Due to the inclined position and the lid position 1008 no water is possible to enter the face up air outtake 1006 and it is very difficult to enter the connections top panel.

This orientation of the portable device combined with the secure cabinet design has a clear advantage over other cabinets that uses typical rack units when rain, water or snow falling outside of the cabinet while the door of the cabinet is open. This natural advantage gets even better when there is a mechanism that makes the lids of the portable devices to slightly close down when the door of the secure cabinet opens. In an exemplary embodiment using a passive mechanical mechanism with wires, elastic cords, sheaves, drivers and hooks as it is seen on FIG. 11 and FIG. 12. In another exemplary embodiment using an active method with an electric motor pulling and releasing the wires that drive the lids of the devices to slightly close.

Figure 11:
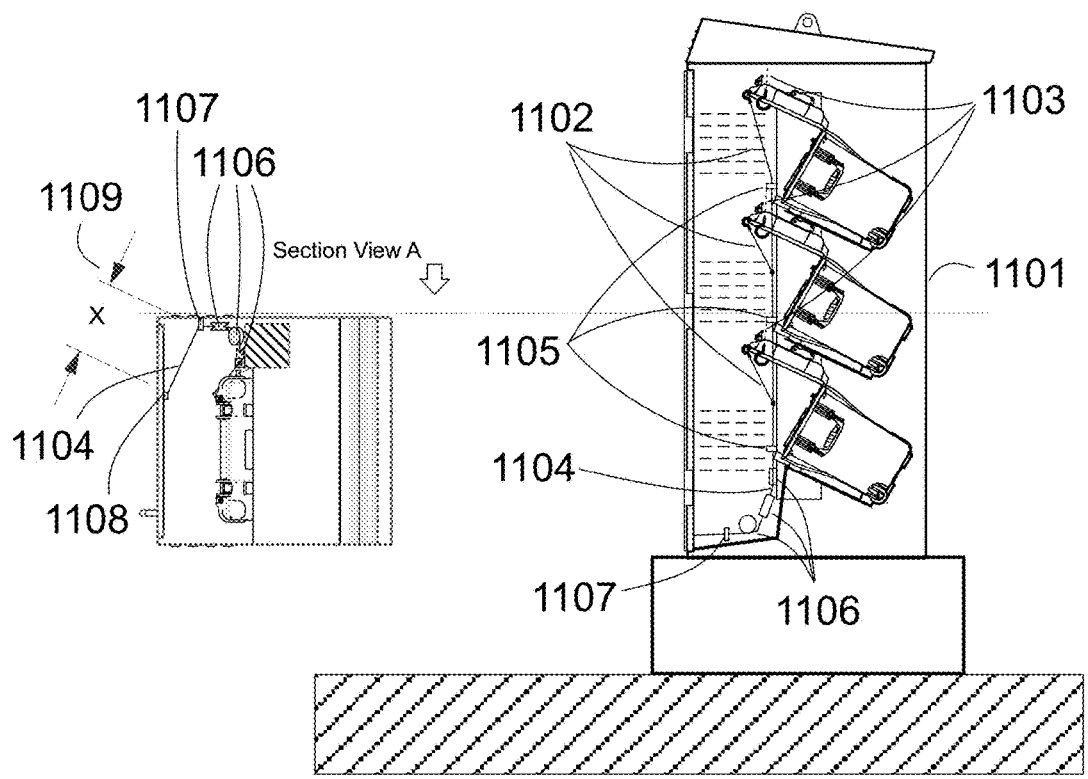
FIG. 11 the secure cabinet side section view with the door closed and the lids in operation positions.

On FIG. 11 we see vertical section view 1101 and we see three wires 1102 with hocks at the end that hold the lids, there are also three elastic cords with hocks that hold the lids open when the wires 1102 are loose with the door closed. The three wires 1101 are connected with the main wire 1104 that passes through a set of three drivers 1105 to end through three sheaves 1106 that guide the wire to the last driver 1107 to the connection with the door 1108.

Figure 12:
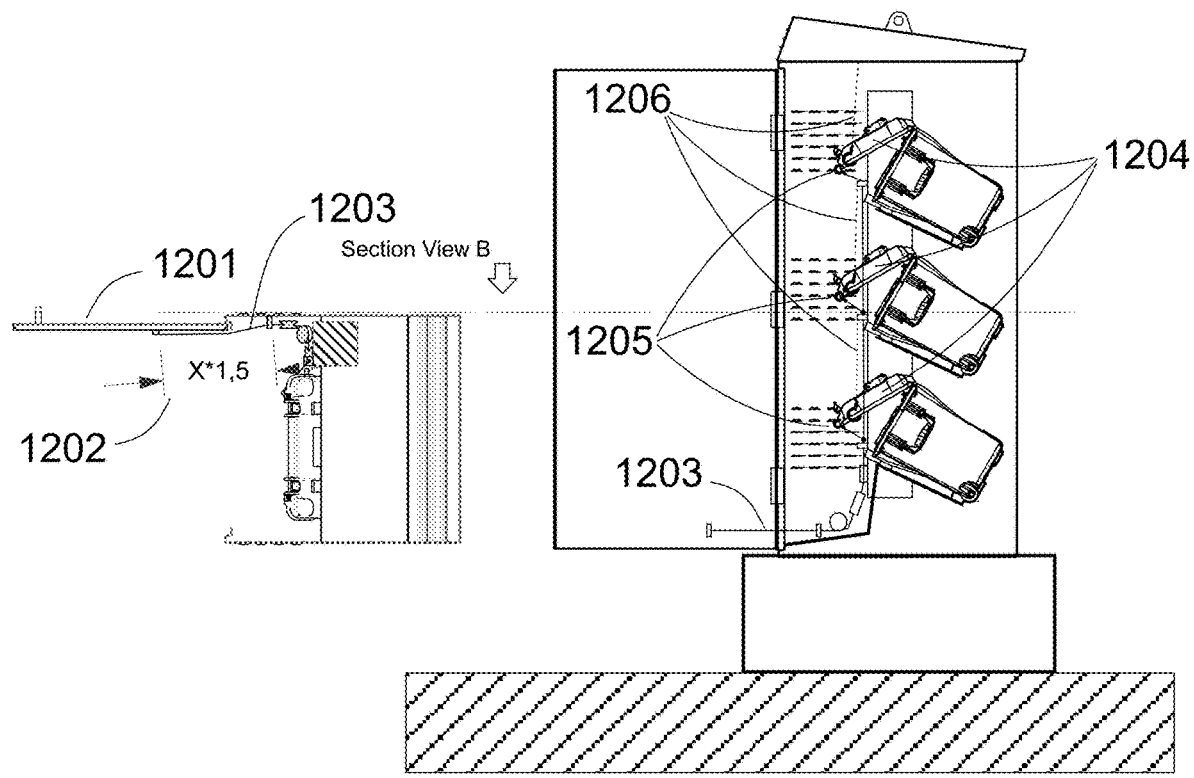
FIG. 12 the secure cabinet side section view with the door open and the lids in semi closed weather protection positions.

When the door is closed the distance 1109 is X, when in FIG. 12 the door is open the distance X is about X*1.5 thus the wire 1203 is pulled and forces the three lids 1204 that are connected with the hocks 1205 to close down while the force from the wire 1203 forces the elastic cords 1206 to expand. In an alternative embodiment the wire 1203 can also be pulled with the use of an electric motor controlled by the security system of the secure cabinet.

Figure 13:
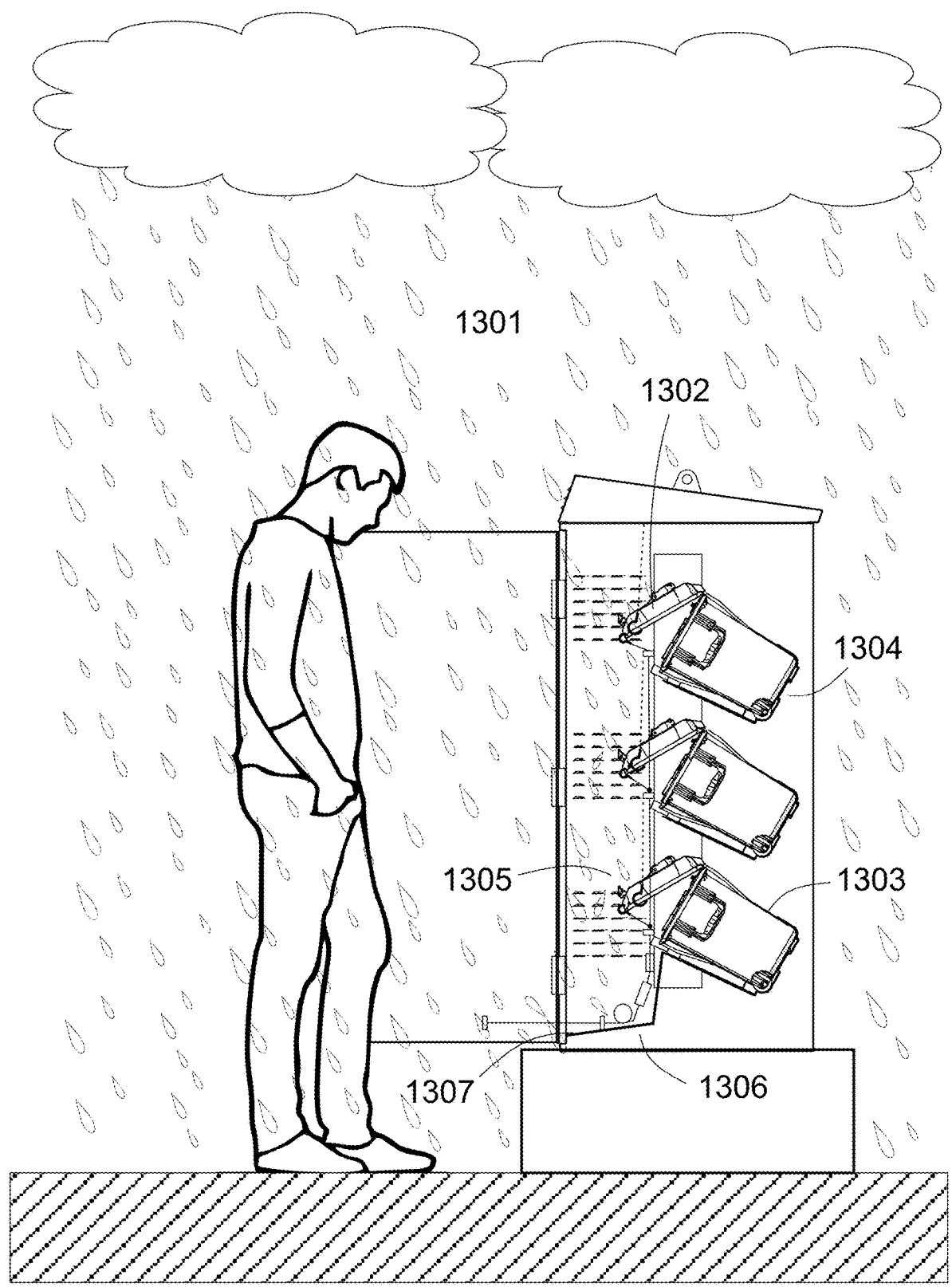
FIG. 13 an illustration of the secure cabinet with side section view in raining weather exhibiting the water draining mechanism.

When the secure cabinet is open FIG. 13 while there is rain 1301, the lids of the devices are closed 1302 and due to the shape 1303 of the device cases, the inclined design of the slots 1304 in the secure cabinet the water hits the lids 1305 and falls down to the drain surface 1306 of the secure cabinet that drives the water in a natural manner outside 1307 of the cabinet.

Figure 14:
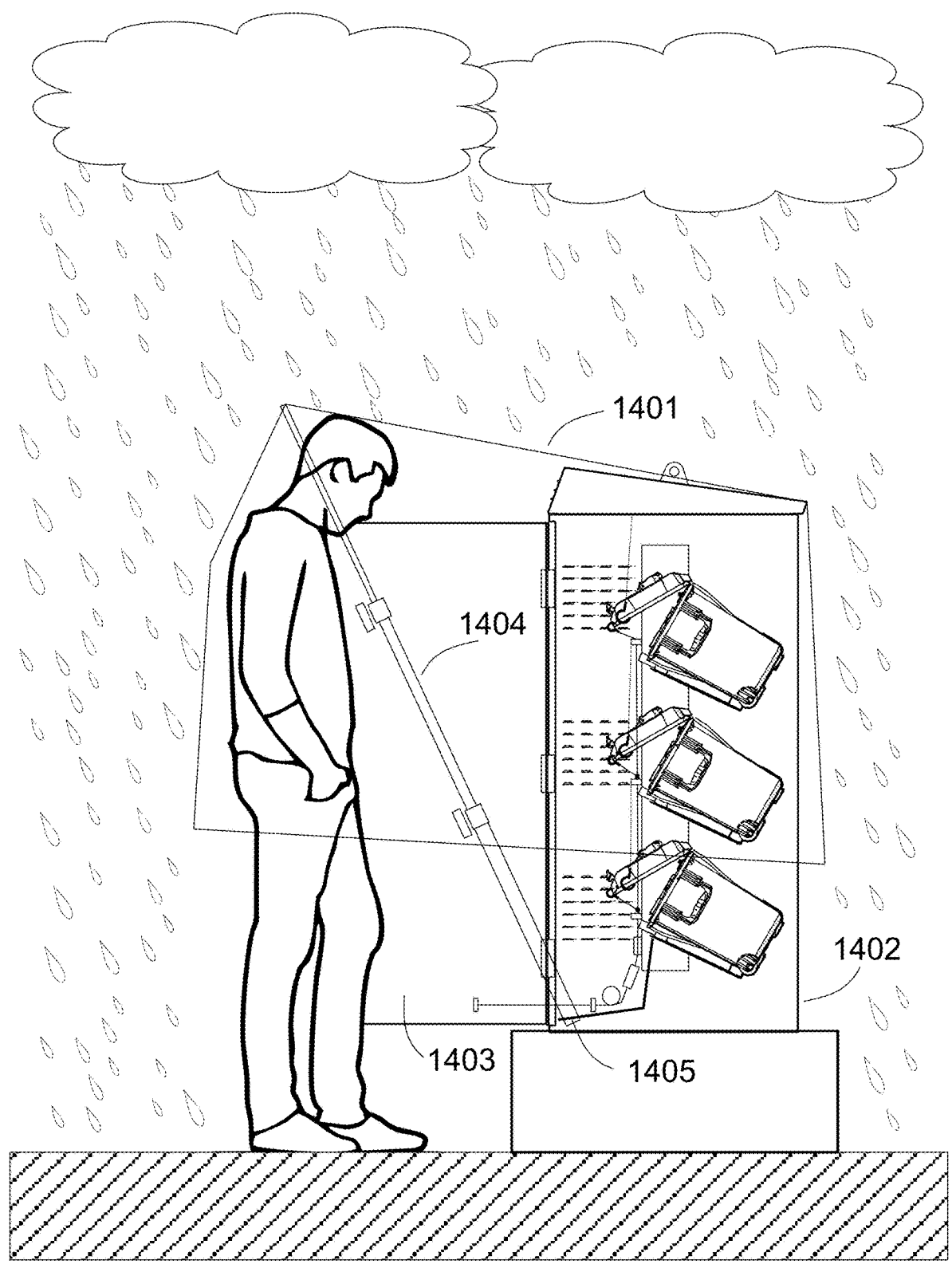
FIG. 14 an illustration of the secure cabinet with side section view in raining weather exhibiting an alternative method of protection against the weather conditions.

In an alternative embodiment FIG. 14 a cover reverse U shape 1401 made by transparent vinyl or similar material can be used to cover the secure cabinet 1402 prior of opening of the door 1403 from the service personnel, then when the door is open and the serviceman is under the cover an expandable pole 1404 may be fitted on the right side of the door opening be pulled out while be mounted on the base of the cabinet door opening 1405 and above the drain surface in order to hold the cover from the opposite side of the door thus creating a protective tent from the rain and the elements for the serviceman and the cabinet to make the whole exchanging device process easier and more safe for the system with much less water ingress.

The previous description of the disclosed exemplary embodiments is provided to enable any person skilled in the art to make or use the present disclosure. Various modifications to these exemplary embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A cabinet for outdoor electronic device storage and retrieval configured for access during inclement weather, the cabinet comprising:
    an enclosure having an interior space, an opening providing access into the interior space, and a door configured in an open state to provide access into the interior space through the opening and in a closed state to close the opening to restrict access into the interior space;
    a plurality of inclined and slotted shelves disposed in the interior space of the enclosure and configured to accommodate and support, in an inclined orientation, respective portable electronic devices each having a case with a top open end and a lid configured to open and close the top open end of the case; and
    means for opening and closing the lids of the portable electronic devices supported by the respective shelves in response to movement of the enclosure door between the open and closed states.

2. The cabinet of claim 1, wherein each of the shelves comprises a protective cover with an opening configured to receive the portable electronic device.

3. The cabinet of claim 2, wherein for each of the shelves supporting the portable electronic device, the protective cover opening has a foam rubber gasket for sealing from water and dust a rear of the enclosure opposite the opening providing access into the interior space.

4. The cabinet of claim 2, wherein each of the shelves and corresponding protective cover are formed in one piece from a plastic material.

5. The cabinet of claim 1, wherein the enclosure has a bottom section with an angled surface serving as a drain for draining out any water from the interior space of the enclosure.

6. The cabinet of claim 1, wherein the enclosure includes an area within the interior space for accommodating at least one of systems for cooling/heating the interior space, DC power supplies with battery backup for the portable electronic devices supported by the respective shelves, and a security system for monitoring opening and closing of the enclosure door.

7. The cabinet of claim 1, wherein the means for opening and closing the lids comprises means for interconnecting the enclosure door to the lid of each of the portable electronic devices supported by the respective shelfs.

8. The cabinet of claim 7, wherein the means for interconnecting comprises at least one of wires and elastic cords.

9. The cabinet of claim 1, wherein the means for opening and closing includes means for at least partially closing the lids of the portable electronic devices when the enclosure door is opened and for opening the lids of the portable electronic devices when the enclosure door is closed.

10. A cabinet for outdoor electronic device storage and retrieval configured for access during inclement weather, the cabinet comprising:
    an enclosure having an interior space, an opening providing access into the interior space, and a door configured in an open state to provide access into the interior space through the opening and in a closed state to close the opening to restrict access into the interior space; and
    a plurality of inclined shelves disposed in the interior space of the enclosure and configured to accommodate and support, in an inclined orientation, respective portable electronic devices each having a case with a top open end and a lid configured to open and close the top open end of the case;
    wherein the enclosure door is configured for coupling to the lids of the portable electronic devices supported by the shelves so that the lids undergo movement between open and closed or partially open and closed positions in relation to movement of the enclosure door between the open and closed states.

11. The cabinet of claim 10, wherein when coupled to the lids of the portable electronic devices supported by the shelves, the enclosure door is configured to be opened so as to at least partially close the lids of the portable electronic devices and is configured to be closed so as to open the lids of the portable electronic devices.

12. The cabinet of claim 10, further comprising wires and elastic cords for coupling the enclosure door with the lids of the portable electronic devices.

13. In combination:
    at least one portable electronic device having a case with a top open end and a lid configured to open and close the top open end of the case;
    a cabinet having an interior space, an opening providing access into the interior space, a door configured in an open state to provide access into the interior space through the opening and in a closed state to close the opening to restrict access into the interior space, and at least one inclined shelf disposed in the interior space and configured to accommodate and support the at least one portable electronic device; and
    means for opening and closing the lid of the at least one portable electronic device supported by the at least one inclined shelf in response to movement of the cabinet door between the open and closed states.

14. The combination of claim 13, further comprising a protective cover for covering the cabinet to protect the cabinet and the at least one portable electronic device during inclement weather when the cabinet door is in the open state.

15. The combination of claim 13, wherein the at least one portable electronic device comprises a plurality of portable electronic devices; and wherein the at least one inclined shelf comprises a plurality of inclined shelves configured to accommodate and support in an inclined orientation the respective plurality of portable electronic devices; and wherein the means for opening and closing comprises means for opening and closing the lids of the plurality of electronic portable storage devices supported by the respective shelves in response to movement of the cabinet door between the open and closed states.

16. The combination of claim 13, wherein the at least one inclined shelf comprises a protective cover with an opening configured to receive the portable electronic device.

17. The combination of claim 16, wherein the cover opening has a foam rubber gasket for sealing from water and dust a rear of the enclosure opposite the opening providing access into the interior space of the cabinet.

18. The combination of claim 16, wherein the at least one inclined shelf and the protective cover are formed in one piece from a plastic material.

19. The combination of claim 13, wherein the cabinet has a bottom section with an angled surface serving as a drain for draining out any water from the interior space of the cabinet.

20. The combination of claim 13, wherein the means for opening and closing includes means for at least partially closing the lids of the portable electronic devices when the cabinet door is opened and for opening the lids of the portable electronic devices when the cabinet door is closed.

* * * * *